(12) United States Patent
Simsek-Ege et al.

(10) Patent No.: US 9,136,278 B2
(45) Date of Patent: Sep. 15, 2015

(54) METHODS OF FORMING VERTICALLY-STACKED MEMORY CELLS

(71) Applicant: Micron Technology, Inc., Boise, ID (US)

(72) Inventors: Fatma Arzum Simsek-Ege, Boise, ID (US); Aaron R. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 14/083,056

(22) Filed: Nov. 18, 2013

(65) Prior Publication Data

US 2015/0140753 A1   May 21, 2015

(51) Int. Cl.
| | |
|---|---|
| *H01L 27/115* | (2006.01) |
| *H01L 29/49* | (2006.01) |
| *H01L 21/02* | (2006.01) |
| *H01L 21/3205* | (2006.01) |
| *H01L 27/108* | (2006.01) |

(52) U.S. Cl.
CPC .... *H01L 27/11582* (2013.01); *H01L 21/02164* (2013.01); *H01L 21/02238* (2013.01); *H01L 21/32051* (2013.01); *H01L 27/10844* (2013.01); *H01L 27/1157* (2013.01); *H01L 27/11556* (2013.01); *H01L 29/4966* (2013.01)

(58) Field of Classification Search
CPC .............. H01L 21/71; H01L 27/11563; H01L 27/1158
See application file for complete search history.

(56) References Cited

U.S. PATENT DOCUMENTS

| | | |
|---|---|---|
| 6,057,193 A | 5/2000 | Wang et al. |
| 6,143,604 A | 11/2000 | Chiang et al. |
| 6,180,454 B1 | 1/2001 | Chang et al. |
| 6,274,471 B1 | 8/2001 | Huang |
| 6,353,242 B1 | 3/2002 | Watanabe et al. |
| 6,661,691 B2 | 12/2003 | Fricke et al. |
| 6,803,318 B1 | 10/2004 | Qiao et al. |
| 7,112,488 B2 | 9/2006 | Helm et al. |
| 7,196,004 B2 | 3/2007 | Lee et al. |
| 7,419,895 B2 | 9/2008 | Lindsay |

(Continued)

OTHER PUBLICATIONS

U.S. Appl. No. 13/675,933, filed Nov. 13, 2012 by Davis et al.

(Continued)

*Primary Examiner* — Cheung Lee
(74) *Attorney, Agent, or Firm* — Wells St. John P.S.

(57) ABSTRACT

Some embodiments include a method of fabricating integrated structures. A metal-containing material is formed over a stack of alternating first and second levels. An opening is formed through the metal-containing material and the stack. Repeating vertically-stacked electrical components are formed along the stack at sidewalls of the opening. Some embodiments include a method of forming vertically-stacked memory cells. Metal-containing material is formed over a stack of alternating silicon dioxide levels and conductively-doped silicon levels. A first opening is formed through the metal-containing material and the stack. Cavities are formed to extend into the conductively-doped silicon levels along sidewalls of the first opening. Charge-blocking dielectric and charge-storage structures are formed within the cavities to leave a second opening. Sidewalls of the second opening are lined with gate dielectric and then channel material is formed within the second opening.

11 Claims, 12 Drawing Sheets

(56) References Cited

U.S. PATENT DOCUMENTS

| | | |
|---|---|---|
| 7,713,819 B2 | 5/2010 | Okajima |
| 7,898,856 B2 | 3/2011 | Aritome |
| 7,906,818 B2 | 3/2011 | Pekny |
| 7,968,406 B2 | 6/2011 | Ramaswamy et al. |
| 8,148,216 B2 | 4/2012 | Arai et al. |
| 8,183,110 B2 | 5/2012 | Ramaswamy et al. |
| 8,237,213 B2 | 8/2012 | Liu |
| 8,278,695 B2 | 10/2012 | Kidoh et al. |
| 8,283,205 B2 | 10/2012 | Pagaila et al. |
| 8,288,811 B2 | 10/2012 | Ramaswamy et al. |
| 8,437,192 B2 | 5/2013 | Lung et al. |
| 8,507,976 B2 | 8/2013 | Joo |
| 2005/0200026 A1 | 9/2005 | Liaw |
| 2007/0004141 A1 | 1/2007 | Kim et al. |
| 2009/0117725 A1 | 5/2009 | Sun |
| 2009/0289297 A1 | 11/2009 | Kim et al. |
| 2009/0296476 A1 | 12/2009 | Shin et al. |
| 2010/0155813 A1 | 6/2010 | Murata et al. |
| 2010/0208503 A1 | 8/2010 | Kuo |
| 2011/0031550 A1 | 2/2011 | Komori et al. |
| 2011/0149656 A1 | 6/2011 | Tang et al. |
| 2011/0177661 A1 | 7/2011 | Song et al. |
| 2011/0180865 A1 | 7/2011 | Ramaswamy |
| 2011/0193153 A1 | 8/2011 | Higuchi et al. |
| 2011/0241098 A1 | 10/2011 | Park et al. |
| 2012/0086072 A1 | 4/2012 | Yun et al. |
| 2012/0119285 A1 | 5/2012 | Yang |
| 2012/0193596 A1 | 8/2012 | Nakazawa |
| 2012/0217564 A1 | 8/2012 | Tang et al. |
| 2012/0231593 A1 | 9/2012 | Joo et al. |
| 2012/0329224 A1 | 12/2012 | Kong et al. |

OTHER PUBLICATIONS

U.S. Appl. No. 13/708,789, filed Dec. 7, 2012 by Keshav et al.
U.S. Appl. No. 13/735,908, filed Jan. 7, 2013 by Hopkins.
U.S. Appl. No. 13/738,147, filed Jan. 10, 2013 by Thimmegowa et al.
U.S. Appl. No. 13/748,747, filed Jan. 24, 2013 by Hopkins et al.
U.S. Appl. No. 13/759,627, filed Feb. 5, 2013 by Thimmegowa et al.
U.S. Appl. No. 13/832,721, filed Mar. 15, 2013 by Intel.
U.S. Appl. No. 13/835,551, filed Mar. 15, 2013 by Fatma Arzum Simsek-Ege.
U.S. Appl. No. 13/838,579, filed Mar. 15, 2013 by Fatma Arzum Simsek-Ege.
U.S. Appl. No. 13/894,481, filed May 5, 2013 by Ramaswamy.
U.S. Appl. No. 13/894,631, filed May 5, 2013 by Ramaswamy.
U.S. Appl. No. 14/069,574, filed Nov. 1, 2013 by Jie Sun et al.

METHODS OF FORMING VERTICALLY-STACKED MEMORY CELLS

TECHNICAL FIELD

Methods of fabricating integrated structures, and methods of forming vertically-stacked memory cells.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory. A NAND cell unit comprises at least one selecting device coupled in series to a serial combination of memory cells (with the serial combination commonly being referred to as a NAND string). Example NAND architecture is described in U.S. Pat. No. 7,898,850. NAND architecture may be configured to comprise vertically-stacked memory cells. Fabrication of the vertically-stacked memory cells may comprise forming openings through a tall stack of alternating electrically conductive levels and electrically insulative levels, which becomes increasingly difficult with higher aspect ratio and smaller critical dimensions of the openings.

DETAILED DESCRIPTION OF THE ILLUSTRATED EMBODIMENTS

In some embodiments, metal-containing masks are utilized to pattern openings during fabrication of vertical NAND strings. The metal-containing masks may be sacrificial, or may be incorporated into select gates associated with the NAND strings. Example embodiments are described with reference to FIGS. 1-12.

Figure 1:
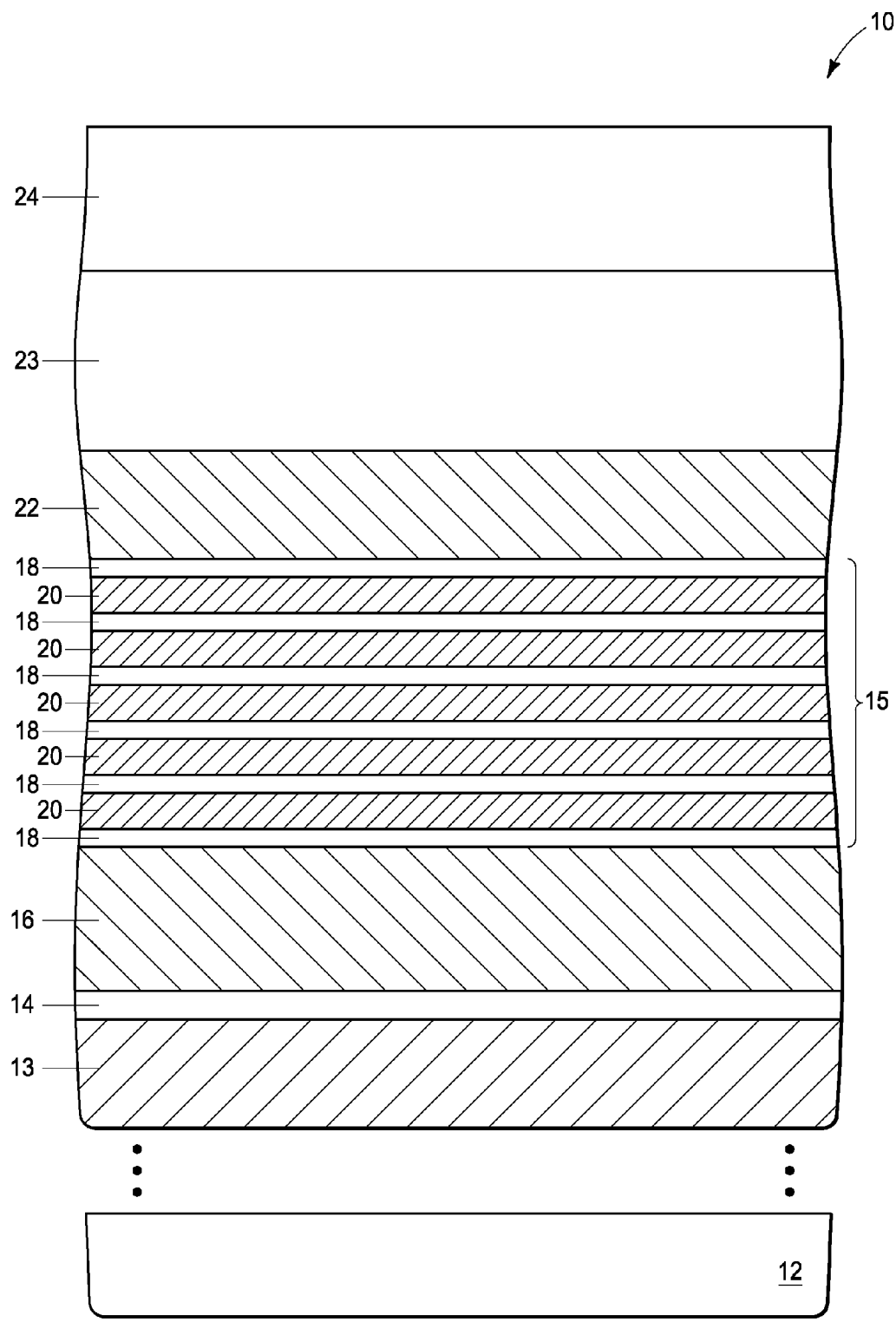
FIGS. 1-11 are cross-sectional views of a semiconductor construction at process stages of an example embodiment method of forming integrated structures.

Referring to FIG. 1, a semiconductor construction 10 is shown to comprise a stack 15 of alternating first and second levels 18 and 20. The levels 18 may be electrically insulative, and the levels 20 may be electrically conductive. The electrically conductive levels 20 may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the electrically conductive levels 20 may comprise n-type doped polycrystalline silicon (i.e., n-type doped polysilicon). The electrically insulative levels 18 may comprise any suitable composition or combination of compositions; and may, for example, comprise silicon dioxide.

The levels 18 and 20 may be of any suitable thicknesses; and may, for example, have thicknesses within a range of from about 10 nm to about 300 nm. In some applications, the levels 18 may be thinner than the levels 20. For instance, levels 18 may be about 20 nm thick and levels 20 may be about 30 nm thick.

The electrically conductive levels 20 may be utilized to pattern control gates of flash devices. In such applications, a vertical string of memory cells (such as, for example, a vertical NAND string of memory cells) may be fabricated, with the number of memory cells in each string being determined by the number of electrically conductive levels 20. The stack may comprise any suitable number of electrically conductive levels. For instance, the stack may have 8 electrically conductive levels, 16 electrically conductive levels, 32 electrically conductive levels, 64 electrically conductive levels, etc.

The stack is over a source-side select-gate material 16, which is over an etchstop material 14.

The source-side select-gate material 16 may comprise any suitable electrically conductive composition or combination of compositions; and may, for example, comprise p-type doped silicon and/or other suitable conductively-doped semiconductor material.

The etchstop material may comprise, for example, one or more oxides; such as, for example, one or more of aluminum oxide, hafnium oxide, etc.

The etchstop material 14 is over a source material 13. The source material may comprise any suitable electrically conductive material; and may, for example, comprise metal (e.g., copper, titanium, tungsten, etc.), metal-containing composition (e.g., metal carbide, metal nitride, metal silicide, etc.) and/or conductively-doped semiconductor material (e.g., conductively-doped silicon, conductively-doped germanium, etc.). In some embodiments, the etchstop material may be omitted, and instead etching may selectively stop at source material 13 (for instance, in some embodiments, material 13 may be tungsten silicide and appropriate etching conditions may be chosen to selectively stop at material 13 during subsequent process stages which may enable processing to be conducted without using a separate etchstop).

The source material 13 is supported by a base 12. A break is provided between the material 13 and the base 12 to indicate that there may be additional materials and/or integrated circuit structures between the base and the material 13.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A metal-containing material 22 is over stack 15, a protective capping material 23 is over the metal-containing material 22, and a carbon-containing material 24 is over the capping material. In some embodiments, metal-containing material 22 may be a drain-side select-gate material.

The metal-containing material 22 may comprise any suitable composition or combination of compositions; including, for example, one or more of elemental metals (e.g., titanium, tungsten, copper, aluminum, ruthenium, etc.) and metal-containing compositions (e.g., metal nitrides, metal carbides, metal silicides, polysilicon with one or more deposited metal layers, etc.). In some embodiments, the metal-containing material 22 is sacrificial. In some embodiments, metal-containing material 22 is incorporated into a drain-side select gate, and accordingly may be referred to as a drain-side select-gate material. In such embodiments, the metal-containing material 22 may comprise, for example, metal nitride; such as, for example, one or both of titanium nitride and tungsten nitride. The metal-containing material 22 may be formed to any suitable thickness, and in some embodiments may be formed to a thickness of from about 120 nm to about 150 nm. In some embodiments, the metal-containing material may be a combination of polysilicon and one or more metal-containing layers, with the metal-containing layers being deposited to thicknesses within a range of from about 20 nm to about 40 nm.

The protective capping material 23 may comprise, for example, silicon nitride and/or silicon dioxide.

The carbon-containing material 24 may comprise, for example, amorphous carbon.

The construction of FIG. 1 may be formed with any suitable processing. For instance, the materials 13, 14, 16, 18, 20, 22, 23 and 24 may be formed in sequential order over base 12 using one or more of atomic layer deposition (ALD), chemical vapor deposition (CVD), and physical vapor deposition (PVD) with appropriate deposition parameters and materials, and utilizing one or more process chambers.

Figure 2:
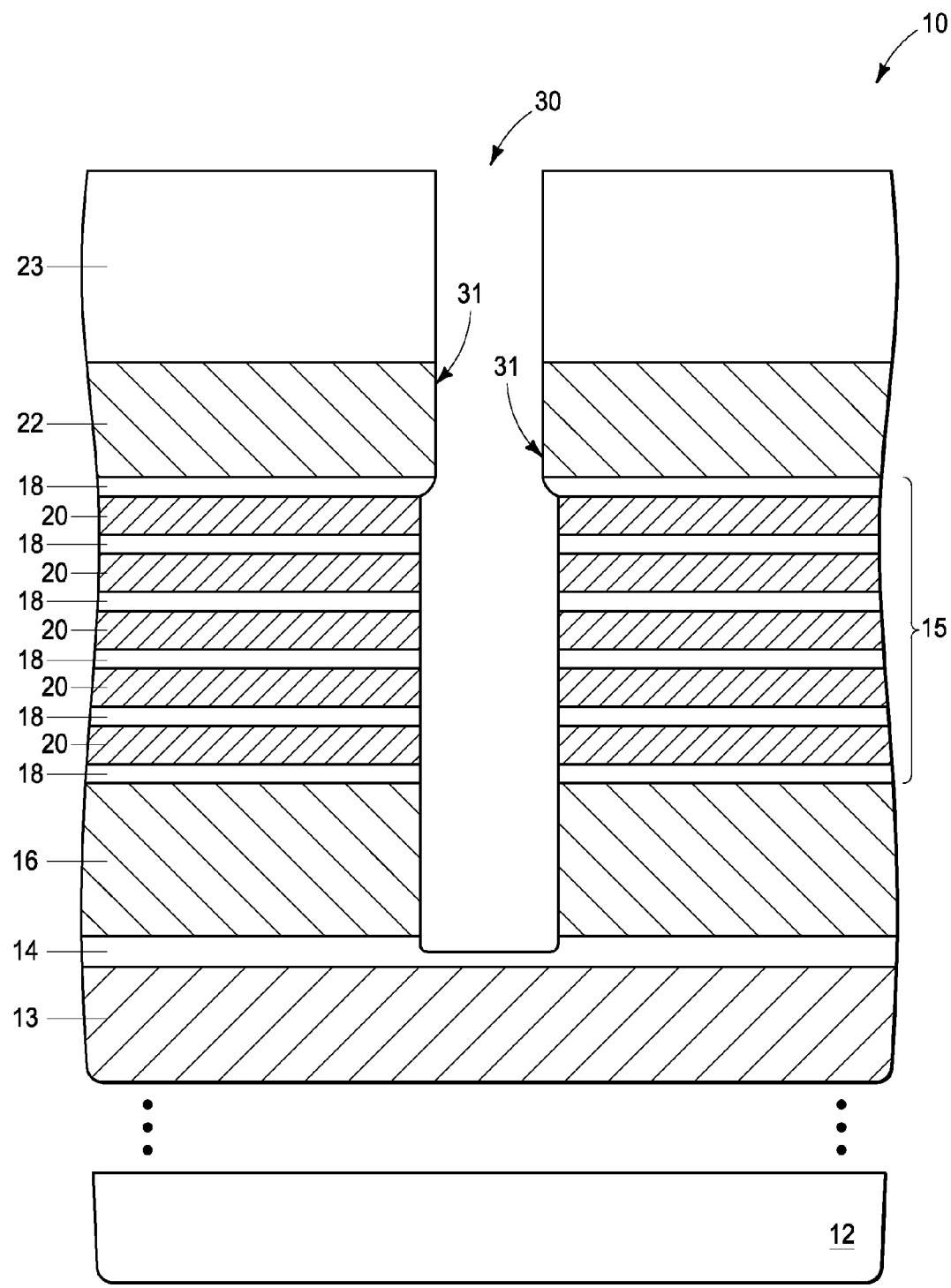

Referring to FIG. 2, an opening 30 is formed to extend through materials 16, 18, 20, 22 and 23; and the carbon-containing material 24 (FIG. 1) is removed. The opening 30 extends to the etchstop material 14, and may even extend partially into such etchstop material. However, the opening does not extend entirely through the etchstop material. The illustrated opening is an example, and a plurality of such openings may be formed and treated during fabrication of an integrated assembly (e.g., a NAND memory array).

The opening 30 may be formed utilizing any suitable processing. For instance, a patterned mask (not shown) may be formed over material 24 (FIG. 1) to define a location of opening 30, and then the opening may be extended through the materials 16, 18, 20, 22 and 23 with one or more etches. The patterned mask and carbon-containing material 24 (FIG. 1) may be removed during and/or after extending opening 30 into one or more of the materials 16, 18, 20, 22 and 23. The patterned mask utilized to define the opening 30 may be any suitable mask, including, for example, photolithographically-patterned photoresist and/or a mask formed utilizing pitch-multiplication methodologies. Since the opening is formed through all of materials 16, 18, 20 and 22 with a single mask, the opening may be considered to be formed through all of such materials in single etch step in some embodiments.

The opening 40 has sidewalls 31. The opening may be a closed shape when viewed from above (for instance, a circle, ellipse, rectangle, square, etc.) so that the illustrated sidewalls 31 are part of a continuous sidewall that extends around such closed shape.

The opening 30 may be a high-aspect-ratio opening, and advantageously has relatively straight sidewalls. In the shown embodiment, the sidewalls stay vertical along metal-containing material 22, and then "blowout" a little upon reaching stack 15. However, in some embodiments the sidewalls along the stack still remain substantially vertical, at least in part due to a metal-containing material 22 functioning as a hardmask during the etching through stack 15.

A problem that may occur in prior art methods of forming an opening through a stack analogous to stack 15 is that the sidewalls along the stack become substantially sloped due to a high-critical-dimension opening becoming much narrower at the bottom relative to the top during the etching utilized to form the opening. Ultimately, vertically-stacked electrical components may be formed along the sidewalls, and the sloped sidewalls may make it difficult to have uniform operating parameters across all of the components. The relatively straight sidewalls achieved when utilizing a metal-containing material 22 as a hardmask can alleviate, and even prevent, such difficulties when fabricating high-critical-dimension openings.

Figure 3:
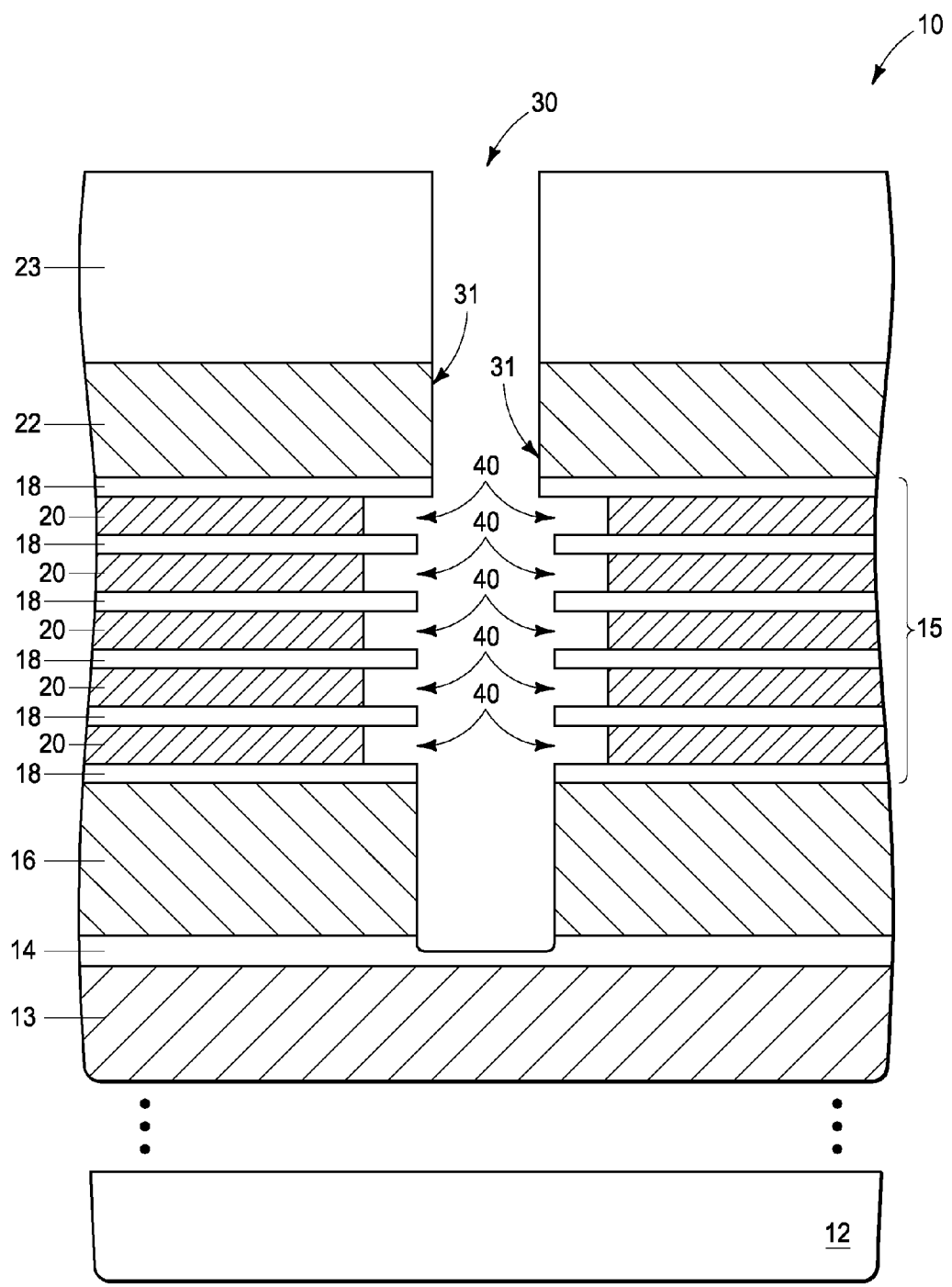

Referring to FIG. 3, cavities 40 are formed to extend into the conductive levels 20 along the sidewalls 31 of opening 30. Such cavities may be formed with an isotropic etch selective for the material of conductive levels 20 relative to the material of insulative levels 18. In some embodiments, conductive levels 20 comprise conductively-doped silicon, insulative levels 18 comprise silicon dioxide, and the cavities 40 are formed utilizing tetramethylammonium hydroxide (TMAH). In the shown embodiment, the metal-containing material 22 is not significantly etched during formation of cavities 40. For instance, if metal-containing material 22 comprises one or both of titanium nitride and tungsten nitride, the material may be substantially resistant to the TMAH etching utilized to form cavities 40.

The conductive material 16 below stack 15 is shown to be substantially resistant to the etch utilized to form cavities 40. In some embodiments, levels 20 comprise n-type doped silicon, and conductive material 16 comprises p-type doped silicon; and the conditions utilized to form cavities 40 are substantially selective for n-type doped silicon relative to p-type doped silicon.

Figure 4:
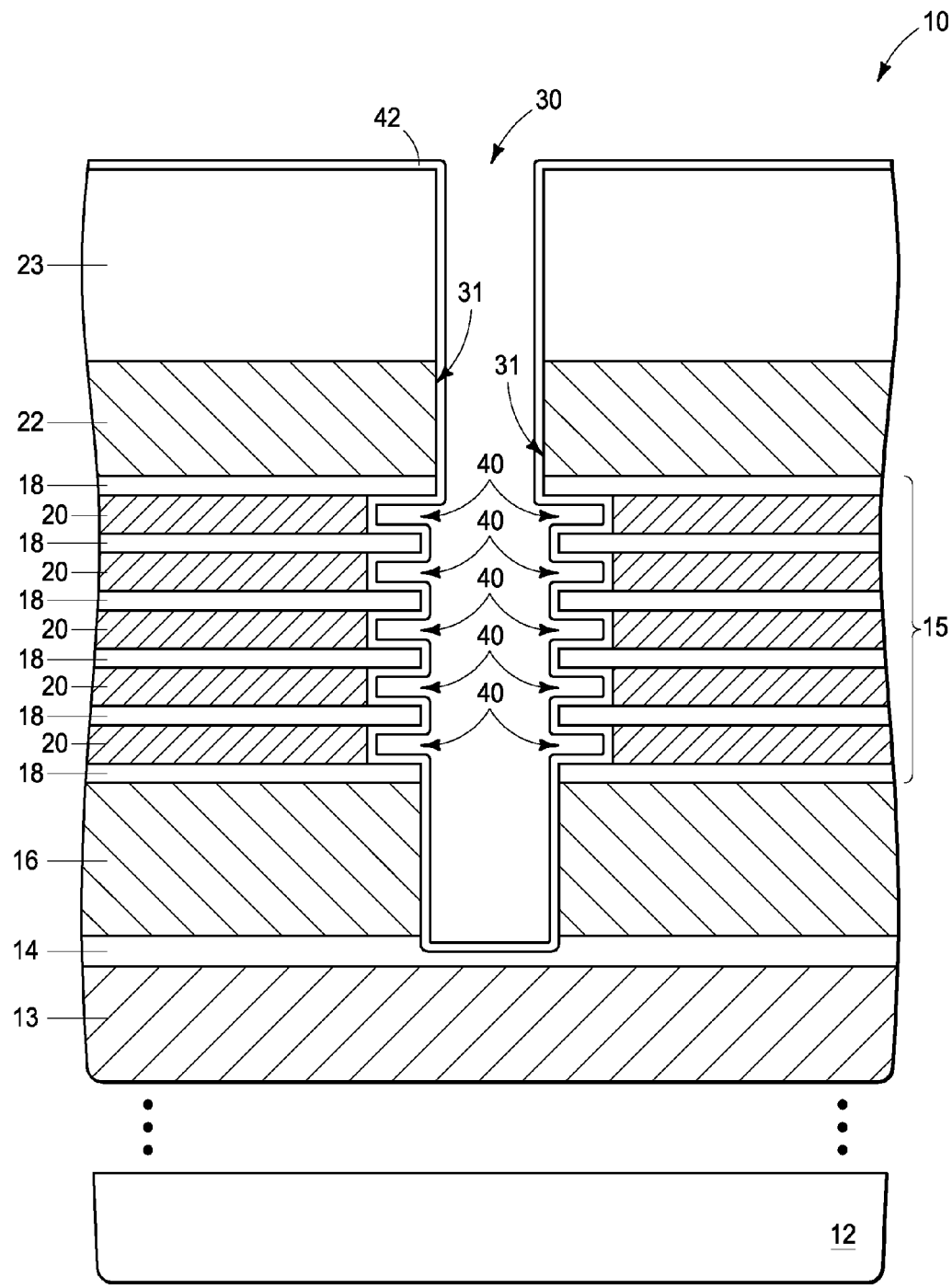

Referring to FIG. 4, charge-blocking dielectric 42 is formed along sidewalls 31 of opening 30 and within cavities 40. The charge-blocking dielectric may comprise any suitable composition or combination of compositions; and in some embodiments may comprise one or more of silicon nitride, silicon dioxide, hafnium oxide, zirconium oxide, etc. For instance, in some embodiments the charge-blocking dielectric 42 may comprise silicon dioxide/silicon nitride/silicon dioxide. In the shown embodiment, the charge-blocking dielectric 42 forms along metal-containing material 22, as well as within cavities 40. In some embodiments, the charge-blocking dielectric may be formed by initially depositing silicon dioxide utilizing tetraethylorthosilicate and ozone (e.g., may be formed with a high-aspect ratio process [HARP]), followed by deposition of silicon nitride, which in turn is followed by additional deposition of silicon dioxide. The initial silicon dioxide may be treated with in situ steam generation (ISSG) in some applications.

Figure 5:
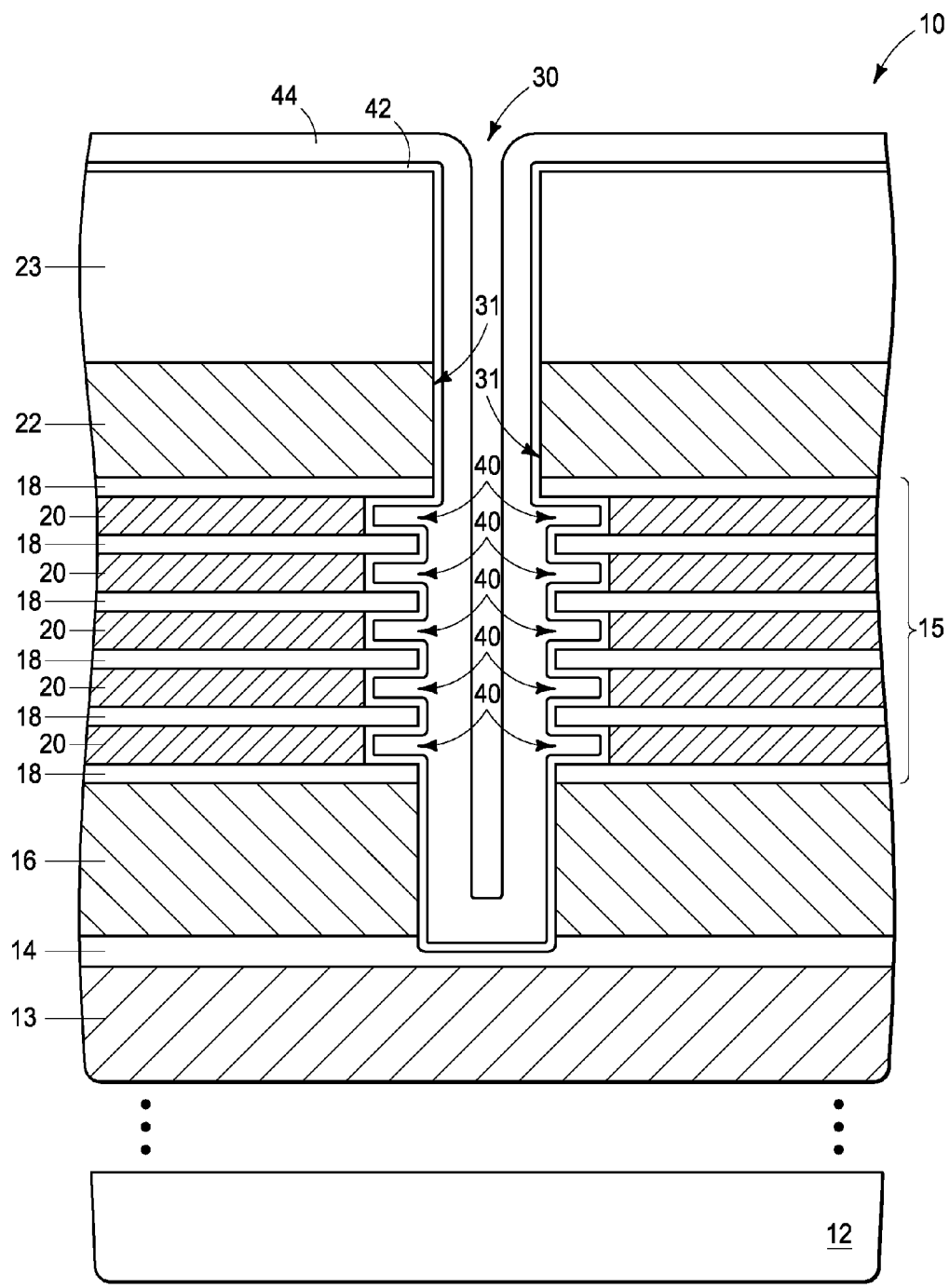

Referring to FIG. 5, charge-storage material 44 is formed over the charge-blocking dielectric 42 and within cavities 40. The charge-storage material may comprise any suitable composition or combination of compositions; and in some embodiments may comprise floating gate material (for instance, doped or undoped silicon) or charge-trapping material (for instance, silicon nitride, metal dots, etc.).

Figure 6:
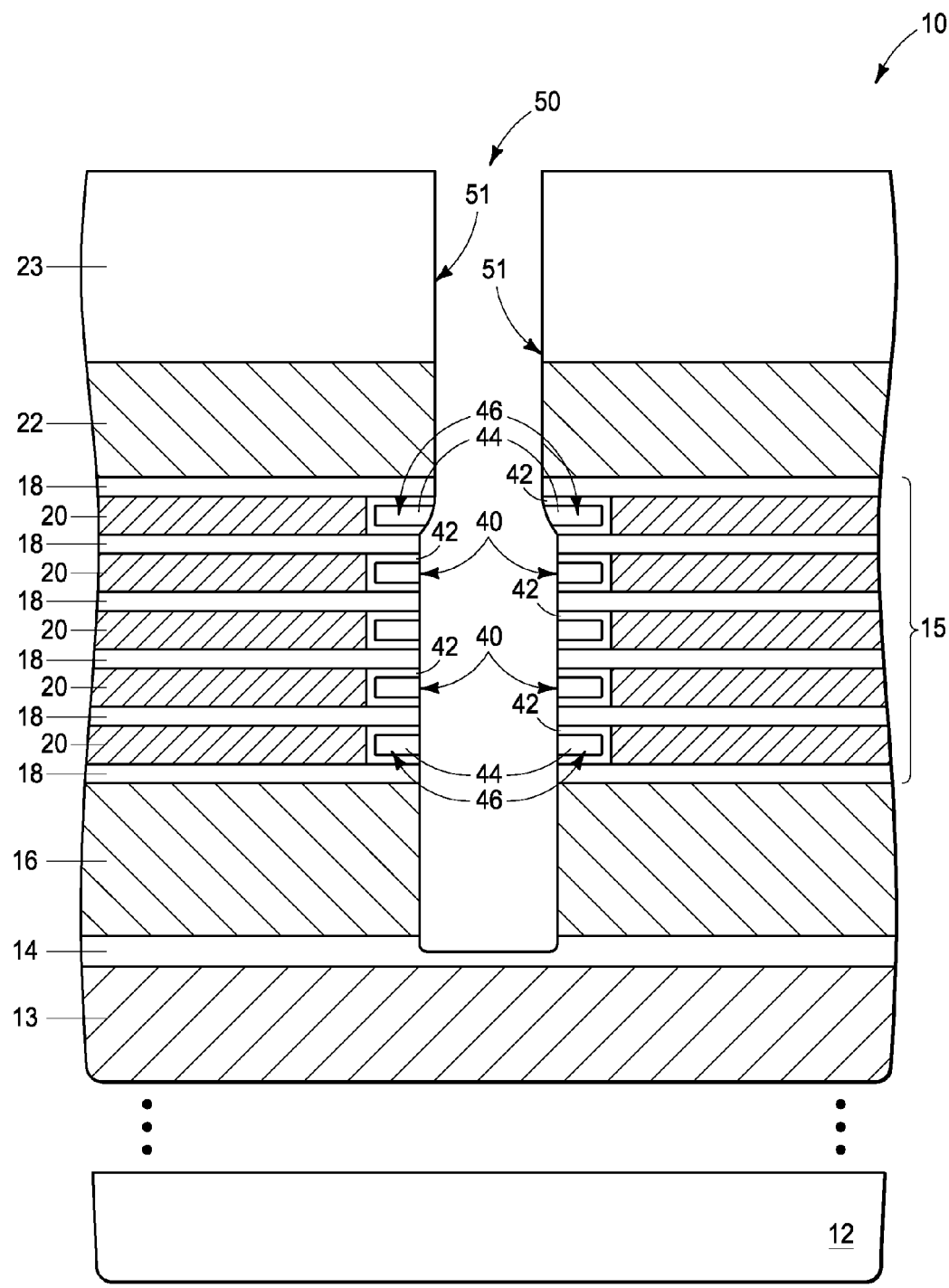

Referring to FIG. 6, the charge-blocking dielectric 42 and charge-storage material 44 are removed from surfaces of materials 16, 22 and 23, while leaving the charge-blocking dielectric 42 and the charge-storage material 44 within cavities 40. Such removal may be accomplished with any suitable processing. For instance, in some embodiments the charge-storage material 44 may be removed utilizing TMAH or hydrofluoric acid vapor. Subsequently, charge-blocking dielectric 42 may be removed with any suitable etch or combination of etches. Such etches may include hot phosphoric acid etching to remove oxide in some embodiments.

The charge-storage material 44 remaining at the processing stage of FIG. 6 is configured as charge-storage structures 46 (only some of which are labeled) within the cavities 40.

The opening remaining at the processing stage of FIG. 6 may be referred to as a second opening 50. Such second opening has sidewalls 51 that extend along materials 16, 22 and 23, and which also extend along surfaces of the charge-storage structures 46.

Figure 7:
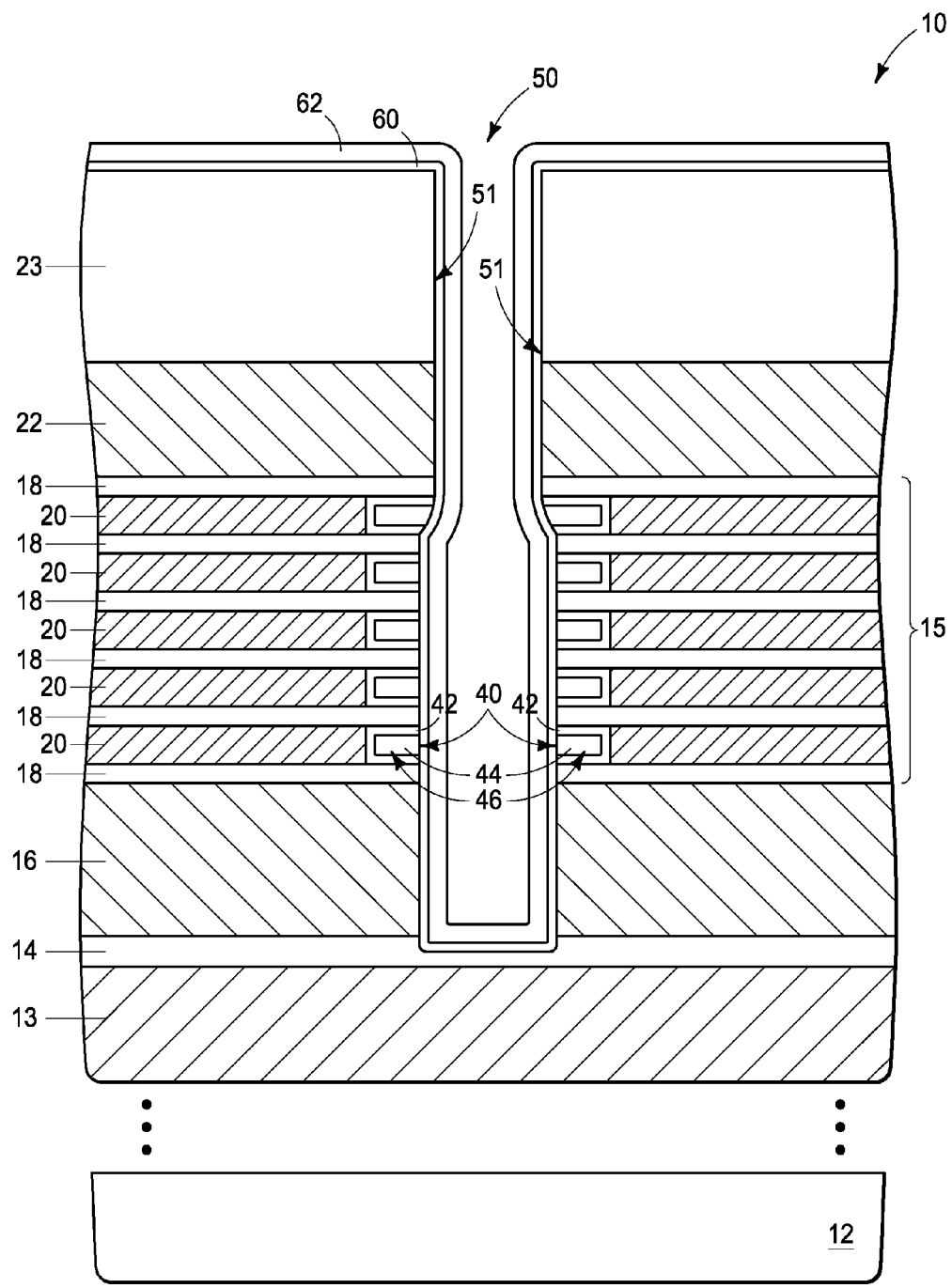

Referring to FIG. 7, gate-dielectric material 60 and protective material 62 are formed along sidewalls 51 of opening 50 to line such sidewalls.

The gate-dielectric material may comprise any suitable composition or combination of compositions; and in some embodiments may comprise one or more of silicon dioxide, hafnium oxide, zirconium oxide, aluminum oxide, etc. In some embodiments, it may be desired to deposit the gate-dielectric material rather than oxidatively grow the gate-dielectric material so that the gate-dielectric material is a common composition across all of the materials 16, 22 and 23. In some embodiments, the gate dielectric may be formed by first depositing a polysilicon liner, and then converting the polysilicon to silicon dioxide utilizing steam (for instance, utilizing ISSG).

The protective material 62 is a sacrificial material, and may comprise any suitable composition or combination of compositions. For instance, in some embodiments the protective material 62 may comprise one or more of silicon nitride, polysilicon, etc.

Figure 8:
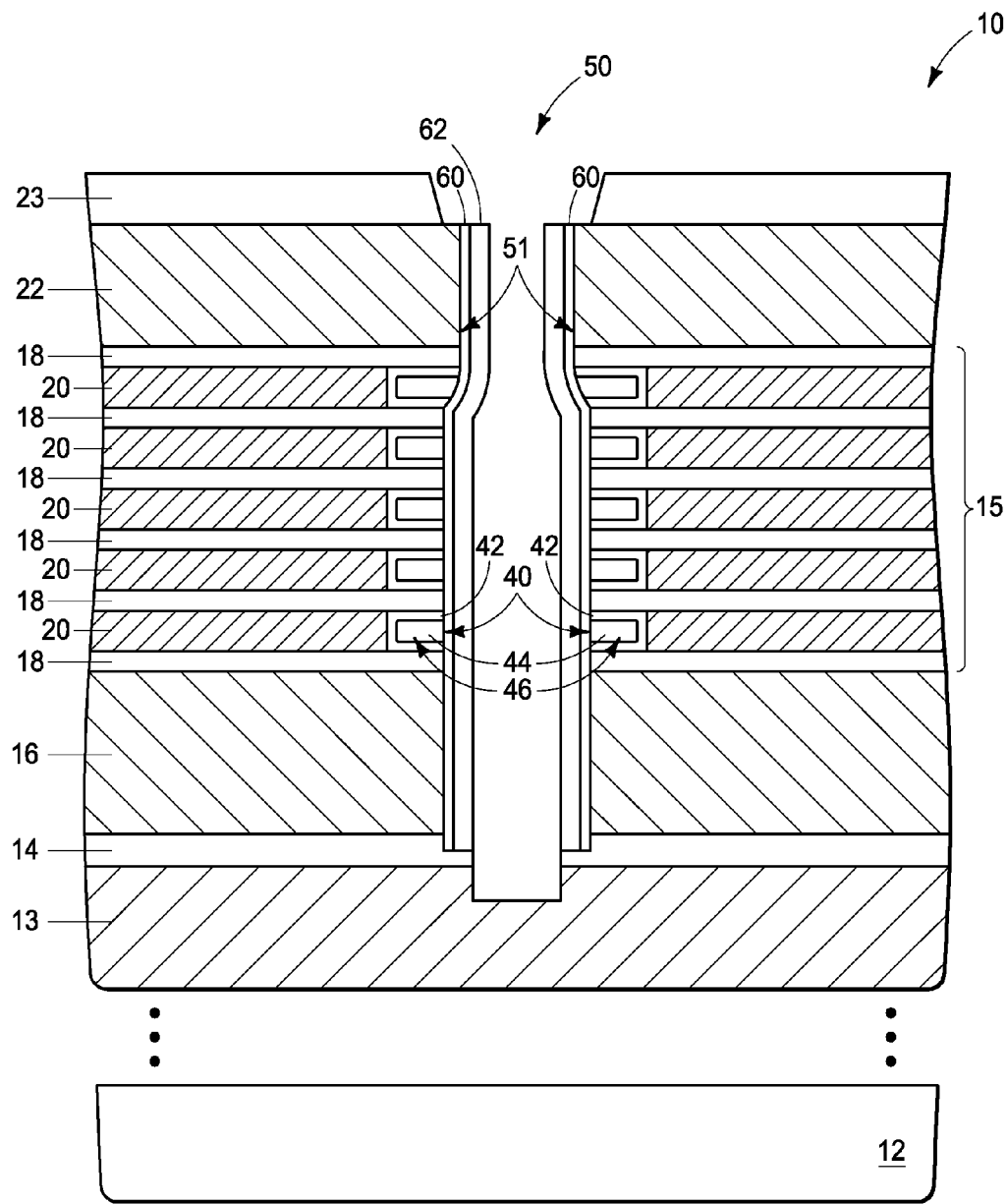

Referring to FIG. 8, an isotropic etch is utilized to punch through the etchstop material 14 at the bottom of the lined second opening 50, which extends the opening to the source material 13. In the shown embodiment, the etch has penetrated partially into the source material. In other embodiments, the etch may extend only to an upper surface of the source material.

The protective material 62 protects the gate dielectric 60 from being degraded by the etch conditions utilized to punch through the etchstop material. In the shown embodiment, the etching conditions utilized to punch through the etchstop material have partially removed the protective capping material 23. In subsequent processing, the remainder of the protective capping material 23 may be removed with a suitable etch; such as, for example, a wet etch selective for material 23 relative to materials 22 and 62.

An advantage of utilizing metal-containing material 22 can be that the metal-containing material is able to provide higher etch selectivity relative to the etching conditions utilized for punching through the etchstop material than would be provided by non-metal-containing materials. Thus, exposure of a region of the upper surface of metal-containing material 22 adjacent opening 50 is not problematic, and instead enables material 22 to be utilized as a hardmask during the punch-through of the etchstop material. The metal-containing hardmask of material 22 may enable a high aspect ratio of opening 50 to be maintained during the punch-through etch.

Figure 9:
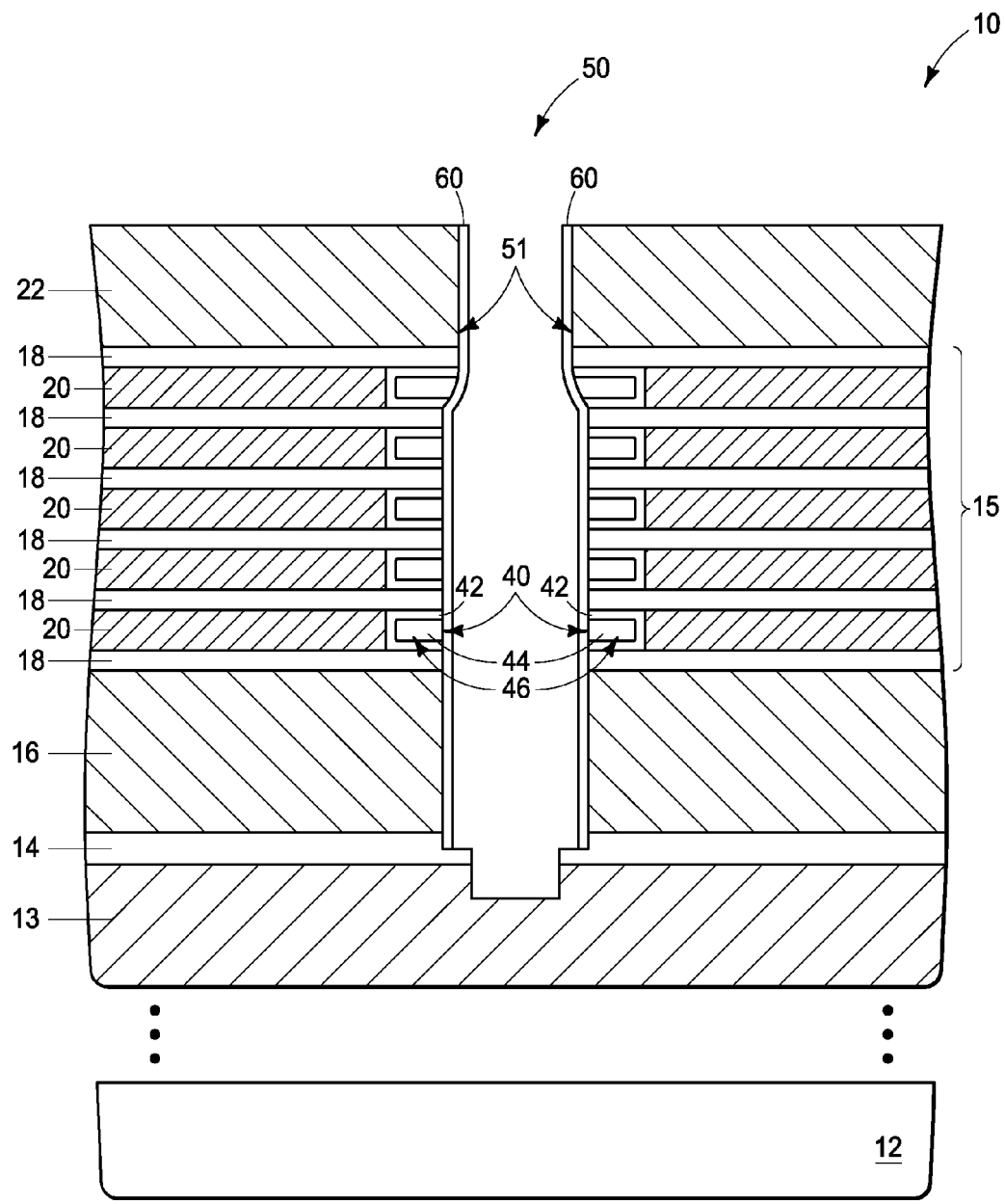

Referring to FIG. 9, the protective capping material 23 (FIG. 8) and protective liner material 62 (FIG. 8) are removed.

Figure 10:
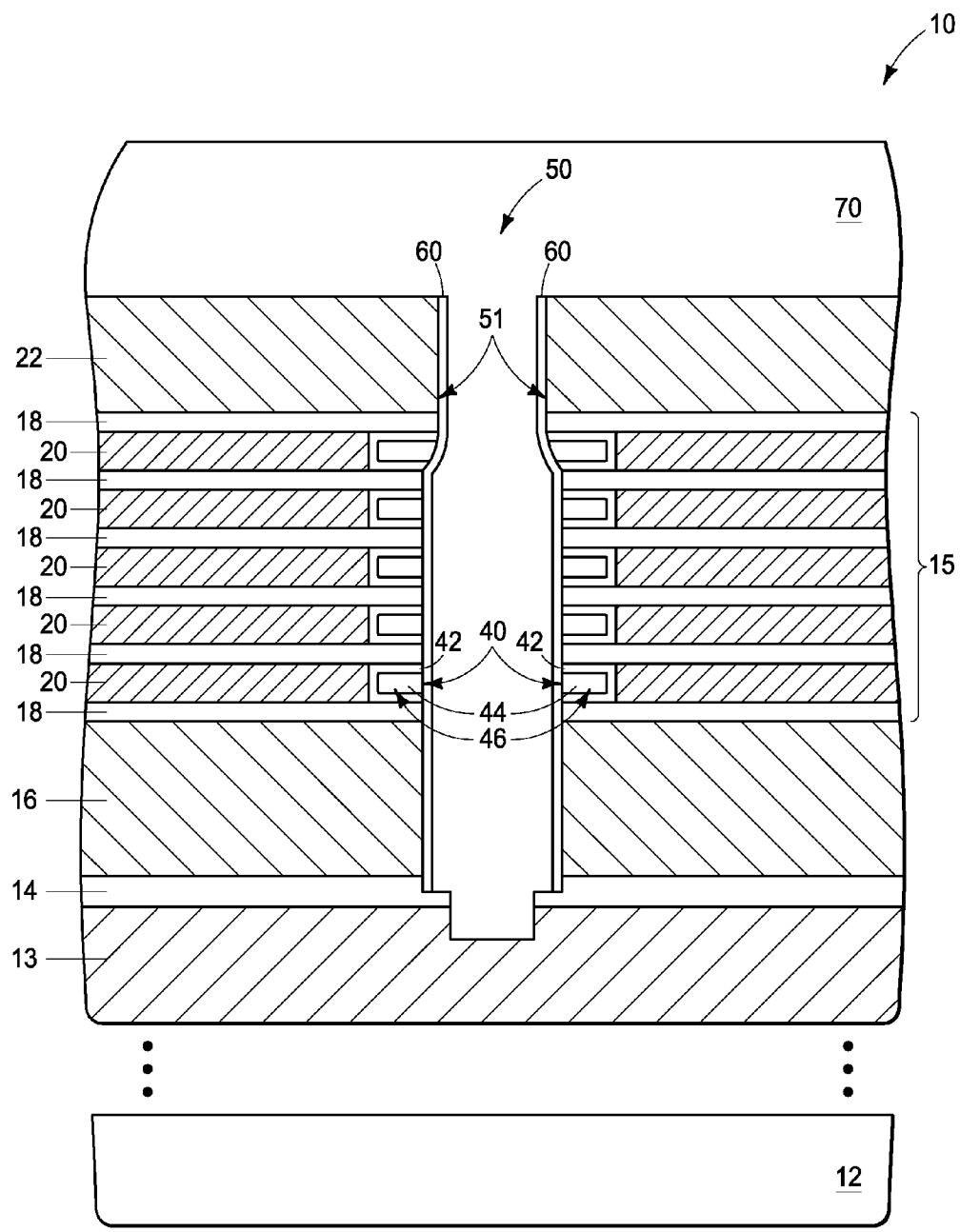

Referring to FIG. 10, channel material 70 is deposited within opening 50. The channel material may comprise any suitable composition or combination of compositions; and in some embodiments may comprise appropriately-doped silicon.

Figure 11:
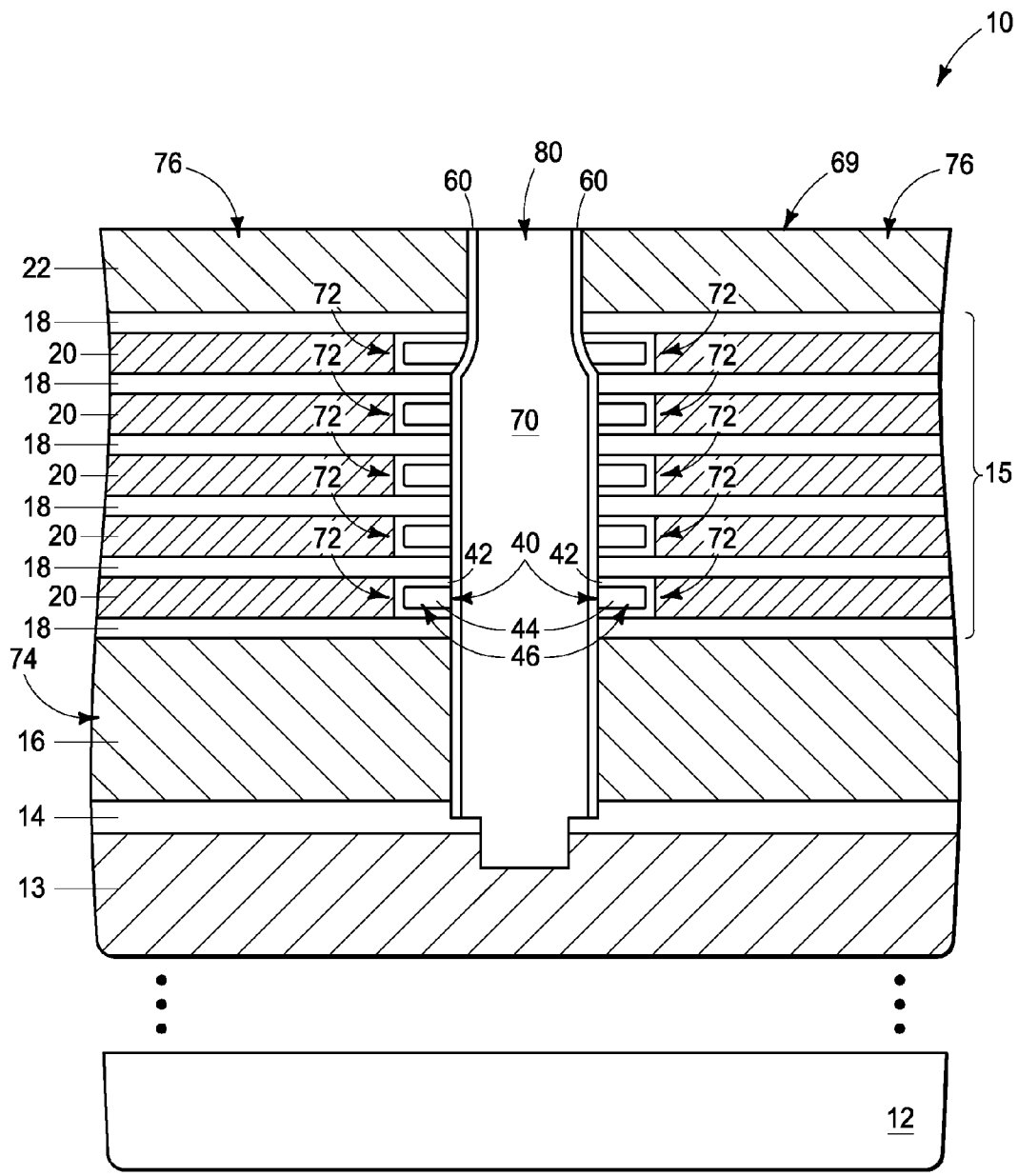

Referring to FIG. 11, construction 10 is subjected to planarization (for example, chemical-mechanical polishing) to form a planarized upper surface 69 extending across materials 22, 60 and 70.

The construction of FIG. 11 comprises vertically-stacked memory cells 72 containing the charge-storage structures 46 and the charge-blocking dielectric 42. In some embodiments, such memory cells may be incorporated into a NAND memory array, and may be considered to be a vertical string of memory cells. The material 16 may form a source-side select gate 74 beneath the vertical string of memory cells, and the metal-containing material 22 may form a drain-side select gate 76 above the vertical string of memory cells.

Utilization of metal-containing material 22 in a drain-side select gate may be advantageous in some embodiments. In other embodiments, metal-containing material 22 may be sacrificial, and may be removed at a processing stage prior to that of FIG. 11. For instance, the material 22 may be removed after the punch-through etch of FIG. 8.

The memory cells 72 are examples of vertically-stacked electrical components that may be formed. In other embodiments, other vertically-stacked electrical components may be formed with processing analogous to that of FIGS. 1-11.

Figure 12:
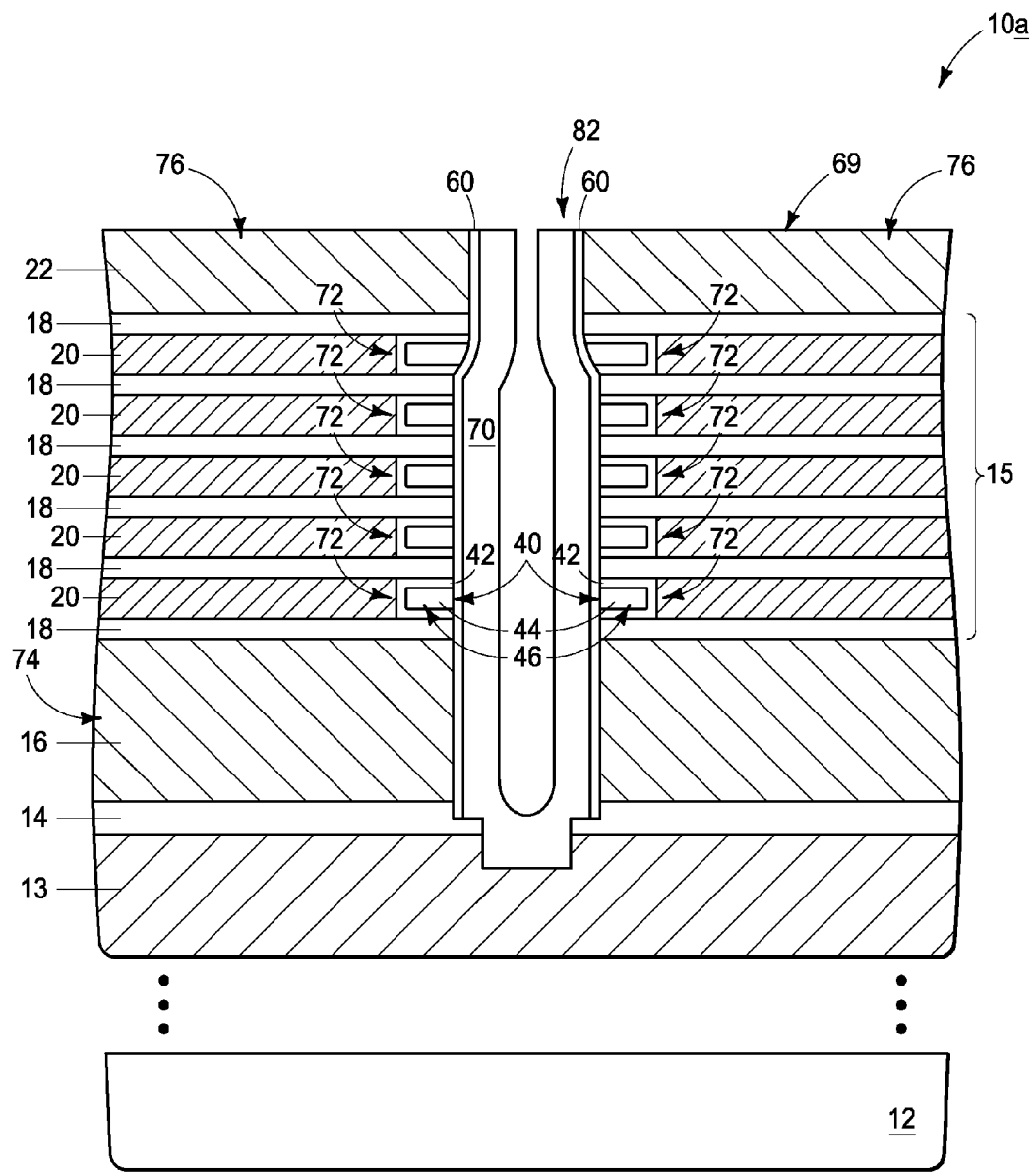
FIG. 12 is a cross-sectional view of a semiconductor construction at a process stage of another example embodiment method of forming integrated structures.

The embodiment of FIG. 11 shows channel material 70 patterned into a solid monolithic plug (or pillar) 80 extending along memory cells 72 and along drain-side select gate 76. In other embodiments, the channel material may be formed to be in other configurations. For instance, FIG. 12 shows a construction 10a analogous to that of FIG. 11, but comprising the channel material 70 configured as a hollow monolithic plug (or pillar) 82 extending along memory cells 72 and along drain-side select gate 76. In some embodiments, it may be advantageous to configure the channel material 70 as a hollow plug in that the channel material 70 will then be a liner of constant thickness along sidewalls of opening 50. Such can enable a uniform thickness of channel material 70 to be maintained along all of the memory cells 72 even if there is variation of the width dimension of opening 50 along the depth of the opening. In some embodiments, opening 50 will have a substantially uniform width along an entirety of the depth (e.g., will have substantially vertical sidewalls instead of problematic tapered sidewalls of prior art constructions).

In some embodiments, utilization of metal-containing material 22 as a hardmask along a drain side of a NAND stack may be advantageously utilized to maintain the critical dimension of high-aspect-ratio structures (for instance, structures having aspect ratios approaching 40:1 or greater), because of the etch selectivity of metal compared to silicon oxide, polysilicon and silicon nitride.

There may be numerous advantages to integrating a drain-side select-gate channel material with memory cell channel material in monolithic channel material pillars (i.e., to forming monolithic pillars (or channels) 80 and 82 of FIGS. 11 and 12). A monolithic channel may provide a string current advantage; and if the monolithic channel is hollow, there may be an additional boost voltage reduction and/or further drain-side select-gate leakage advantage. In some embodiments, the monolithic pillars may be formed utilizing one-step etching through metal-containing drain-side select-gate material and alternating levels under the drain-side select-gate material.

The constructions discussed above may be utilized for fabrication of integrated structures which are incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The term "integrated structure" means any structure utilized in integrated circuitry; such as structures supported by silicon chips, and including structures utilized in integrated memory, integrated logic, etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of fabricating integrated structures. A metal-containing drain-side select-gate material is formed over a stack of alternating first and second levels. An opening is formed which extends through the metal-containing drain-side select-gate material and through the stack of alternating first and second levels. Repeating vertically-stacked electrical components are formed along the stack of alternating first and second levels at sidewalls of the opening. A monolithic channel material pillar is formed which fills the opening and extends along the electrical components and along the metal-containing drain-side select-gate material.

Some embodiments include a method of fabricating integrated structures. A metal-containing material is formed over a stack of alternating first and second levels. An opening is formed which extends through the metal-containing material and through the stack of alternating first and second levels. Repeating vertically-stacked electrical components are formed along the stack of alternating first and second levels at sidewalls of the opening.

Some embodiments include a method of forming vertically-stacked memory cells. A metal-containing material is formed over a stack of alternating silicon dioxide levels and conductively-doped silicon levels. A first opening is formed to extend through the metal-containing material and the stack. Cavities are formed to extend into the conductively-doped silicon levels along sidewalls of the first opening. Charge-blocking dielectric and charge-storage structures are formed within the cavities. A second opening remains after forming the charge-blocking dielectric and the charge-storage structures. The second opening has sidewalls extending along the metal-containing material and the charge-storage structures. The sidewalls of the second opening are lined with gate dielectric. Channel material is formed within the lined second opening.

Some embodiments include a method of forming vertically-stacked memory cells. A source-side select-gate material is formed over a source material. A stack of alternating silicon dioxide levels and conductively-doped silicon levels is formed over the source-side select-gate material. A metal-containing drain-side select-gate material is formed over the stack. A first opening is formed to extend through the drain-side select-gate material, the stack and the source-side select-gate material. Cavities are formed to extend into the conductively-doped silicon levels along sidewalls of the first opening. Charge-blocking dielectric and charge-storage structures are formed within the cavities. A second opening remains after forming the charge-blocking dielectric and the charge-storage structures. The second opening has sidewalls extending along the source-side select-gate material, the drain-side select-gate material, and the charge-storage structures. The sidewalls of the second opening are lined with gate dielectric. A bottom of the lined second opening is punched through to extend the second opening to the source material. Channel material is formed within the extended second opening.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming vertically-stacked memory cells, comprising:
   forming a source-side select-gate material over a source material;
   forming a stack of alternating silicon dioxide levels and conductively-doped silicon levels over the source-side select-gate material;
   forming a metal-containing drain-side select-gate material over the stack;
   forming a first opening to extend through the drain-side select-gate material, the stack and the source-side select-gate material; the first opening not extending into the source material;
   forming cavities extending into the conductively-doped silicon levels along sidewalls of the first opening;
   forming charge-blocking dielectric and charge-storage structures within the cavities; a second opening remaining after forming the charge-blocking dielectric and the charge-storage structures; the second opening having sidewalls extending along the source-side select-gate material, the drain-side select-gate material, and the charge-storage structures;
   lining the sidewalls of the second opening with gate dielectric;

punching through a bottom of the lined second opening to extend the second opening into the source material; and forming channel material within the extended second opening.

2. The method of claim 1 wherein the channel material forms a solid plug within the extended second opening.

3. The method of claim 1 wherein the channel material forms a hollow plug within the extended second opening.

4. The method of claim 1 wherein the source-side select-gate material comprises conductively-doped semiconductor material.

5. The method of claim 1 wherein the source-side select-gate material comprises p-type doped silicon.

6. The method of claim 1 wherein the drain-side select-gate material comprises metal nitride.

7. The method of claim 1 wherein the drain-side select-gate material comprises titanium nitride.

8. The method of claim 1 wherein the drain-side select-gate material comprises tungsten nitride.

9. The method of claim 1 wherein a protective capping material is over the drain-side select-gate material during formation of the first opening, and is removed prior to forming the channel material.

10. The method of claim 9 wherein a protective capping material comprises one or both of silicon dioxide and silicon nitride.

11. The method of claim 1 wherein an etch stop material comprises an oxide.

* * * * *